United States Patent
Herrman et al.

(10) Patent No.: US 9,244,120 B2
(45) Date of Patent: *Jan. 26, 2016

(54) SIMULATION OF PRINTED CIRCUIT BOARD IMPEDANCE VARIATIONS AND CROSSTALK EFFECTS

(75) Inventors: Bradley D. Herrman, Cary, NC (US); Bhyrav M. Mutnury, Austin, TX (US); Terence Rodrigues, Austin, TX (US)

(73) Assignee: LENOVO ENTERPRISE SOLUTIONS (SINGAPORE) PTE. LTD., Serangoon Garden (SG)

(*) Notice: Subject to any disclaimer, the term of this patent is extended or adjusted under 35 U.S.C. 154(b) by 765 days.

This patent is subject to a terminal disclaimer.

(21) Appl. No.: 13/524,213

(22) Filed: Jun. 15, 2012

(65) Prior Publication Data

US 2012/0249162 A1   Oct. 4, 2012

Related U.S. Application Data

(63) Continuation of application No. 12/732,255, filed on Mar. 26, 2010, now Pat. No. 8,289,043.

(51) Int. Cl.
*G01R 35/00* (2006.01)
*G01R 31/28* (2006.01)

(52) U.S. Cl.
CPC ................. *G01R 31/2896* (2013.01)

(58) Field of Classification Search
CPC .. H01L 23/49827; G01R 21/06; G01R 23/02; G01R 33/0023; G01R 33/0283; G01R 31/2896; G01R 35/005; G01R 27/02; G01R 29/0814; G01R 29/0892; G01R 31/27; G01R 31/2806; G01R 33/02; H01F 21/08; H01F 29/14
See application file for complete search history.

(56) References Cited

U.S. PATENT DOCUMENTS

| | | | |
|---|---|---|---|
| 3,792,385 A | | 2/1974 | Napoli |
| 3,818,328 A | * | 6/1974 | Zinn ............................ 324/252 |
| 5,004,317 A | | 4/1991 | Jackson |
| 5,430,417 A | | 7/1995 | Martin |
| 5,631,572 A | | 5/1997 | Sheen |
| 6,028,427 A | | 2/2000 | Kawase |
| 6,242,923 B1 | | 6/2001 | Scaman |

(Continued)

FOREIGN PATENT DOCUMENTS

JP   2000-266825 A1   9/2000

OTHER PUBLICATIONS

M. Frommberger et al., Processing and application of magnetoelastic thin films in high-frequency devices, Microelectronic Engineering, 2003, pp. 588-594, 67-68, Center of Advanced European Studies and Research (CAESAR), Boon, Germany.

(Continued)

*Primary Examiner* — Vinh Nguyen
(74) *Attorney, Agent, or Firm* — Olive Law Group, PLLC (57) ABSTRACT

A method for altering an impedance of a conductive pathway on a microelectronic package includes applying a magnetic field to the conductive pathway. The microelectronic package may be, for example, a printed circuit board. The method also includes controlling a magnitude of the magnetic field at the conductive pathway for altering the impedance of the conductive pathway. The magnetic field may be applied by, for example, an electromagnet or a permanent magnet. A magnetic field may also be applied for simulating crosstalk effects on a conductive pathway.

21 Claims, 4 Drawing Sheets

(56) References Cited

U.S. PATENT DOCUMENTS

| | | |
|---|---|---|
| 6,401,330 B2 | 6/2002 | Baldwin |
| 6,459,272 B1 | 10/2002 | Yamashita |
| 6,639,144 B1 | 10/2003 | Toh |
| 6,958,600 B1 | 10/2005 | Affaticati et al. |
| 7,250,781 B2 | 7/2007 | Nakagawa |
| 7,667,980 B2 | 2/2010 | Baker |
| 2004/0233108 A1 | 11/2004 | Bordi |
| 2006/0052957 A1 | 3/2006 | Hidehira |
| 2009/0102487 A1 | 4/2009 | Cases |
| 2009/0308649 A1 | 12/2009 | Cases |
| 2011/0234238 A1 | 9/2011 | Herrman et al. |

OTHER PUBLICATIONS

H. Hauser et al., MI effect in amorphous CoFe thin film trilayers and demonstrator packaging, 2007, pp. 281-286, 30th IEEE ISSE, IEEE, New York, United States of America.

Ikeda et al., Frequency-Modulation Type Magnetic Field Sensor using Transmission-Line Magnetic Device, IEEE Transactions of Magnetics, Sep. 1999, pp. 3631-3633, vol. 35, No. 5, IEEE, New York, United States of America.

Office Action dated Apr. 25, 2012 for U.S. Appl. No. 12/732,255.

Reply to Office Action dated May 17, 2012 for U.S. Appl. No. 12/732,255.

Notice of Allowance for U.S. Appl. No. 12/732,255.

\* cited by examiner

SIMULATION OF PRINTED CIRCUIT BOARD IMPEDANCE VARIATIONS AND CROSSTALK EFFECTS

CROSS REFERENCE TO RELATED APPLICATIONS

This is a continuation of U.S. patent application Ser. No. 12/732,255, filed Mar. 26, 2010, now U.S. Pat. No. 8,289,043, and titled SIMULATION OF PRINTED CIRCUIT BOARD IMPEDANCE VARIATIONS AND CROSSTALK EFFECTS, the content of which is hereby incorporated by reference in its entirety.

BACKGROUND

1. Field of the Invention

The present invention relates to testing microelectronic packages, and more specifically, to methods and systems of simulating impedance variations and crosstalk effects during testing of printed circuit boards.

2. Description of Related Art

In many modern electronic systems, printed circuit boards and various other microelectronic packages are used to connect electronic components together for communication. A printed circuit board is typically a flat panel that interconnects electronic components using a pattern of flat conductive pathways, often referred to as traces, which are formed on a non-conductive substrate. A printed circuit board may contain conductive pathway patterns on the top and bottom surfaces of the printed circuit board or in layers through the interior of the printed circuit board. Conductive pathways on different layers of a printed circuit board interconnect through vias. Vias are conductive pathways that plate the walls of holes extending through the layers of the printed circuit board.

A single printed circuit board typically includes one or more conductive pathways between a transmitter and a receiver. A conductive pathway may include one or more traces, vias, or combinations thereof connected together for allowing electronic components, such as the transmitter and receiver, to propagate signals to one another using electronic conduction. The transmitter and receiver may be mounted to the printed circuit board and connected at designated portions of a trace pattern, often referred to as pads or lands. The transmitter and receiver may be connected to the printed circuit board using, for example, surface mount technology, through-hole mounting technology, or any other suitable technology as known to those skilled in the art. Surface mount technology connects electronic components to a printed circuit board by soldering electronic component leads or terminals to the top surface of the printed circuit board. Through-hole mount technology connects electronic components to a printed circuit board by inserting component leads through holes in the printed circuit board and then soldering the leads in place on the opposite side of the printed circuit board.

As printed circuit board data transmission speeds increase and transmission signals include frequency components with wavelengths comparable to the length of conductive pathways, it becomes necessary to use transmission line design techniques. The transition from lumped element behavior to transmission line behavior depends upon signal edge rates and on the total delay in the pulse transmission through a conductive pathway. In a lumped element mode, inductance and capacitance appear to the pulse to be concentrated at a point within the printed circuit board such that these factors do not need to be considered in design. On the other hand, in a transmission line mode, inductance and capacitance appear to be uniformly distributed throughout the interconnection, and as far as the pulse is concerned, the conductive pathway is infinite in length, and all the characteristics of wave propagation must be taken into consideration. Similar transmission line design techniques may be used for electrical characterization of conductive pathways in all microelectronic packages. Basic transmission line design parameters of interest include propagation delay, characteristic impedance, reflection coefficient, crosstalk, and risetime degradation.

Field failure of printed circuit boards can arise from variations between bulk-manufactured printed circuit boards and laboratory-tested printed circuit boards. Variations causing field failure can be due, for example, to the over-etch or under-etch of traces. As a result, the impedance of a particular conductive pathway in a bulk-manufactured printed circuit board can vary significantly among several bulk-manufactured printed circuit boards. For example, if the impedance variation in a trace of a bulk-manufactured printed circuit board is about 12%, a differential pair impedance having a nominal 100 ohm impedance at nominal value could be expected to vary between about 88 ohms and 112 ohms for testing purposes. When a printed circuit board is produced in a laboratory, it is most often aligned towards nominal impedance and has little manufacturing variation. Accordingly, there is a need for simple and accurate methods for simulating manufacturing variations during laboratory testing. Particularly, there is a need for convenient methods for simulating the impact of printed circuit board impedance variations within a laboratory environment.

Crosstalk is another transmission line parameter of interest to be varied within a laboratory environment. Crosstalk is any phenomenon by which a signal transmitted on one conductive pathway or other source creates an undesired effect in another conductive pathway. Accordingly, there is a need for convenient methods for simulating the effects of crosstalk on a conductive pathway of a printed circuit board during testing.

BRIEF SUMMARY

One or more embodiments of the present invention provide a method for altering an impedance of a conductive pathway on a microelectronic package such as, but not limited to, a printed circuit board. The method includes applying a magnetic field to a conductive pathway on the microelectronic package. Such a magnetic field may be applied by, for example, but not limited to, an electromagnet or permanent magnet. The method includes controlling a magnitude of the magnetic field at the conductive pathway for altering the impedance of the conductive pathway. The magnitude of the magnetic field at the conductive pathway may be controlled by, for example, but not limited to, selectively positioning a magnetic field generator with respect to the conductive pathway. With respect to use of an electromagnet, the magnitude of the magnetic field may also be controlled by controlling the strength of current through a coil of the electromagnet.

One or more embodiments of the present invention provide a method for simulating a range of possible manufacturing variations during testing of a microelectronic package such as, but not limited to, a printed circuit board. The method includes using a magnetic field generator to apply a magnetic field to a conductive pathway on the microelectronic package. The method also includes measuring an impedance of the conductive pathway while the magnetic field is being applied to the conductive pathway. Further, the method includes calibrating the magnetic field generator based on the measured impedance. The method also includes using the magnetic field generator to control the magnitude of the magnetic field to alter the impedance of the conductive pathway to be within a predetermined impedance range. Further, the method includes testing the microelectronic package while the impedance of the conductive pathway is altered.

One or more embodiments of the present invention provide a method for simulating effects of crosstalk on a conductive pathway of a microelectronic package. The method includes applying a magnetic field to a conductive pathway on the microelectronic package. Further, the method includes controlling a magnitude of the magnetic field at the conductive pathway for altering a crosstalk effect on the conductive pathway. A magnetic field generator as described herein may be used for applying the magnetic field to the conductive pathway.

DETAILED DESCRIPTION

Exemplary methods and systems for simulating printed circuit board impedance variations and crosstalk effects in accordance with embodiments of the present invention are described herein. Particularly, described herein are exemplary methods and systems for simulating bulk-manufactured printed circuit board impedance variations in accordance with embodiments of the present invention are described herein. In addition, exemplary methods and systems for simulating crosstalk effects in microelectronic packages in accordance with embodiments of the present invention are described herein.

It will be recognized by those skilled in the art that the methods and systems described herein may also be similarly applied to simulation of impedance variations or crosstalk effects in any type of microelectronic package. Using the methods and systems described herein, researchers and engineers can conveniently simulate impedance variations or crosstalk effects in a conductive pathway of a printed circuit board for testing of the printed circuit board. In this way, researchers and engineers can verify whether a printed circuit board having a particular design will satisfactorily function if manufactured having the tested impedance variations or crosstalk effects. By verifying that a printed circuit board will operate within the tested impedance variations or crosstalk effects, the likelihood of field failure can be significantly reduced.

As mentioned above, conductive pathways in printed circuit board and other microelectronic packages behave as transmission lines as transmission speeds increase and transmission signals include frequency components with wavelengths comparable to the length of the conductive pathways. For the purpose of transmission line design, a transmission line may be represented by the following components: resistance (R), inductance (L), capacitance (C), and conductance (G). By applying Kirchoff's voltage and current law, the following equations may be used for modeling a small length $\Delta x$ of a conductive pathway:

$$v(x, t) - R\Delta x i(x, t) - L\Delta x \frac{\partial i(x, t)}{\partial t} - v(x + \Delta x, t) = 0$$

$$i(x, t) - G\Delta x v(x + \Delta x, t) - C\Delta x \frac{\partial v(x + \Delta x, t)}{\partial t} - i(x + \Delta x, t) = 0$$

Solving the second order differential equation results in the following equations for voltage and current waves, V(x) and I(x), respectively:

$$V(x) = V_0^+ e^{-\gamma x} + V_0^- e^{+\gamma x}$$

$$I(x) = I_0^+ e^{-\gamma x} + I_0^- e^{+\gamma x}, \text{ where}$$

$$\gamma = \alpha + j\beta = \sqrt{(R + j\omega L)(G + j\omega C)},$$

$$\alpha = \frac{1}{2}\left(R\sqrt{\frac{C}{L}} + G\sqrt{\frac{L}{C}}\right), \text{ and}$$

$$\beta = \omega\sqrt{LC}.$$

In these equations, $\gamma$ is the complex propagation constant, $\alpha$ is the attenuation constant, and $\beta$ is the propagation constant. Solving for impedance provides the characteristic impedance of the transmission line as provided in the following equations:

$$\gamma = \alpha + j\beta = \sqrt{\frac{R + j\omega L}{G + j\omega C}}$$

for a lossy transmission line; and $$Z_0 = \sqrt{\frac{L}{C}}$$

for a loss less transmission line.

Figure 1:
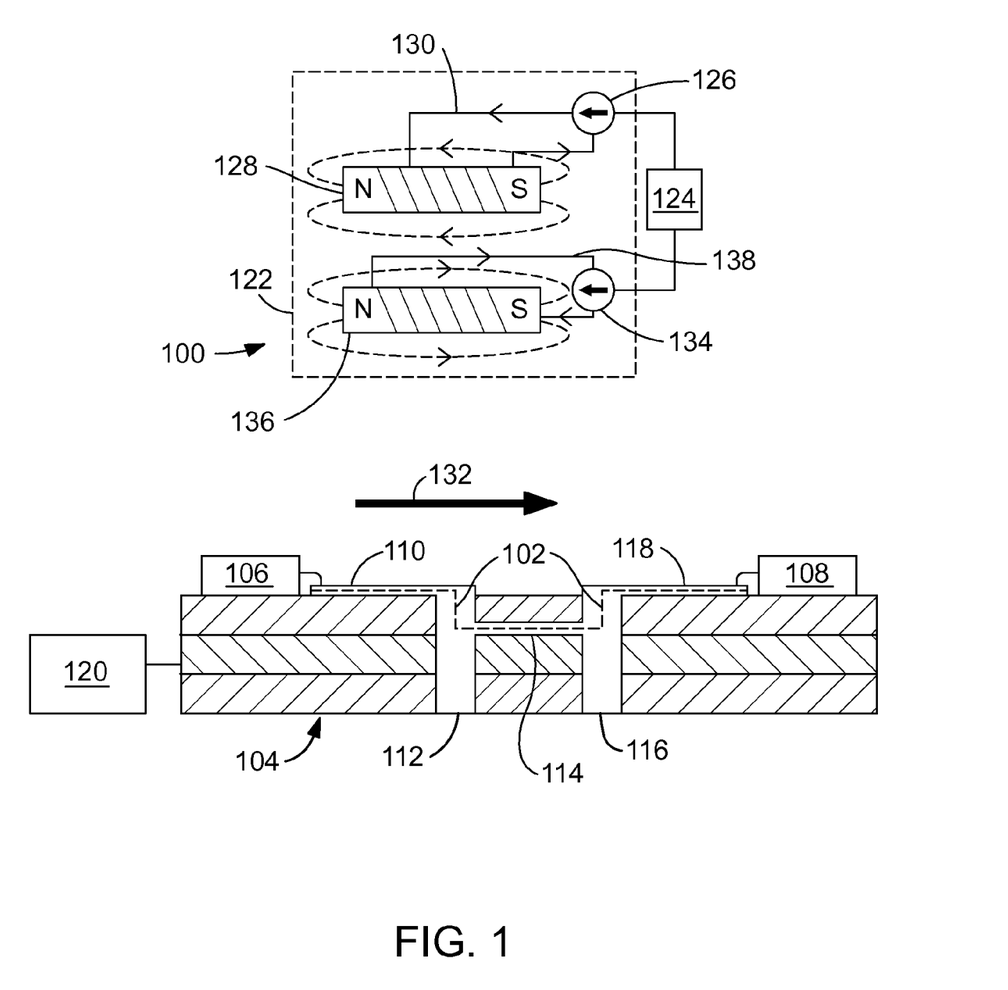
FIG. 1 sets forth a cross-sectional front plan view of a printed circuit board and a magnetic field generator according to embodiments of the present invention.
Figure 2:
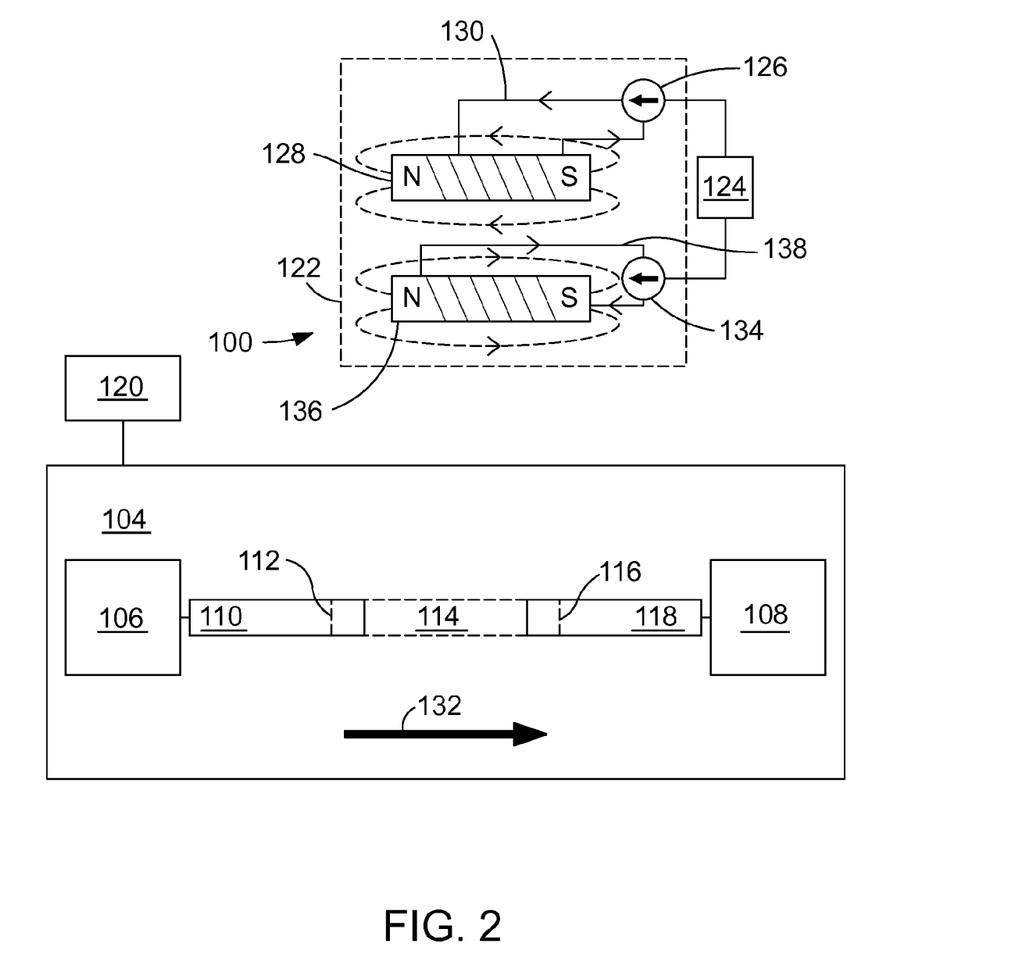
FIG. 2 sets forth a top plan view of a printed circuit board and a magnetic field generator according to embodiments of the present invention.

In accordance with one or more embodiments of the present invention, a magnetic field can be applied to a conductive pathway on a printed circuit board under testing for altering an impedance of the conductive pathway. The impedance of the conductive pathway can be altered to impedances within a range that can be expected due to manufacturing variations. FIG. 1 sets forth a system 100 for applying a magnetic field to a conductive pathway 102 on a printed circuit board 104, illustrated in cross-sectional front plan view, to alter an impedance of the conductive pathway 102 in accordance with embodiments of the present invention. The conductive pathway 102 extends between a transmitter 106 and a receiver 108. FIG. 2 sets forth in top plan view the exemplary printed circuit board 104 and the system 100 illustrated in FIG. 1. The transmitter 106 and the receiver 108 of FIGS. 1 and 2 mount to the surface of the printed circuit board 104 and connect to the printed circuit board 104 at contact pads. The transmitter 106 and the receiver 108 may be connected to the printed circuit board 104 using any suitable technology as understood by those skilled in the art. The conductive pathway 102 includes trace 110, via 112, trace 114, via 116, and trace 118, and provides a path that allows the transmitter 106 to propagate a transmission signal to the receiver 108 by electrical conduction.

The printed circuit board 104 may be tested in a laboratory environment using laboratory test equipment 120 as understood by those skilled in the art. For example, the printed circuit board 104 may be tested for detecting the presence of hardware failures induced by faults in the manufacturing process or by operating stress or wearout mechanisms. The behavior of the digital system of the printed circuit board 104 may be characterized by discrete responses to discrete operating state/input signal permutations such that testing of digital circuits may be achieved by checking their behavior under at least a portion of every operating mode and input signal permutation. The test equipment 120 may apply tests to the printed circuit board 104 while impedance variations, crosstalk effects, or both are simulated on the printed circuit board 104 as described herein in accordance with one or more embodiments of the present invention.

During testing of the printed circuit board 104, the system 100 includes a magnetic field generator 122 and a computing device 124 to simulate potential manufacturing variations or adverse operational effects of the printed circuit board 104 that could affect system performance. The magnetic field generator 122 is communicatively coupled to the computing device 124 for receiving control signals from the computing device 124. Particularly, the computing device 124 communicates control signals to the magnetic field generator 122 for controlling a magnitude of the magnetic field generated by the magnetic field generator 122. By selectively positioning the magnetic field generator 122 in proximity to the conductive pathway 102 of the printed circuit board 104 and controlling the magnitude of the magnetic field generated by the magnetic field generator 122, the magnitude of the magnetic field applied to the conductive pathway 102 is controllable, and as a result, the impedance of the conductive pathway 102 is alterable. A researcher or engineer can thereby operate the computing device 124 to alter the impedance of the conductive pathway 102 for simulating impedance variations that could result from bulk-manufacturing processes or for simulating crosstalk effects.

In this example, the magnetic field generator 122 includes a current source 126 and an electromagnet 128. The computing device 124 is coupled to the current source 126 and configured to communicate control signals to the current source 126 for controlling the generation of electric current by the current source 126. The current source 126 may generate electric current and communicate the electric current through a conductive line 130 of the electromagnet 128. At least a portion of the conductive line 130 is wound in a coil, where several turns of the conductive line 130 are positioned side by side. When electric current flows through the conductive line 130, the flow of current in the coil generates a magnetic field in the interior of the coil and in an area surrounding the coil. The magnitude of the magnetic field is weaker at positions further from the coil. Accordingly, the coil of the electromagnet 128 may be selectively positioned with respect to the conductive pathway 102 for controlling the variance of the magnitude of the magnetic field applied to the conductive pathway 102. Therefore, the impedance in the conductive pathway 102 can be varied based on the position of the electromagnet 128 with respect to the conductive pathway 102. As the electromagnet 128 is moved closer to the conductive pathway 102, the impedance of the conductive pathway 102 increases. Conversely, as the electromagnet 128 is moved further from the conductive pathway 102, the impedance of the conductive pathway 102 decreases. Accordingly, a researcher or engineer can selectively position the electromagnet 128 with respect to the conductive pathway 102 to selectively alter the impedance of the conductive pathway 102 for simulating impedance variations that could result from bulk-manufacturing processes. The positioning of the electromagnet 128 with respect to a conductive pathway will vary depending on the strength of the magnetic field generated by the electromagnet 128, the physical topology of the printed circuit board 104, and the desired alteration to the impedance of the conductive pathway 102.

The magnitude of the magnetic field applied to the conductive pathway 102 may also be varied by controlling current passing through the conductive line 130 of the electromagnet 128. The computing device 124 may control the current source 126 to output current through the conductive line 130 of the electromagnet 128 for generating a magnetic field. By increasing the strength of the current flow through the conductive line 130, the magnitude of the magnetic field generated by the electromagnet 128 increases. Conversely, by decreasing the strength of the current flow through the conductive line 130, the magnitude of the magnetic field generated by the electromagnet 128 decreases. By increasing the magnitude of the magnetic field at the conductive pathway 102, the impedance of the conductive pathway 102 is increased. Conversely, by decreasing the magnitude of the magnetic field at the conductive pathway 102, the impedance of the conductive pathway 102 is decreased. The computing device 124 can communicate control signals to the current source 126 for varying the strength of the current flow and can thus control the magnitude of the magnetic field for controlling the impedance of the conductive pathway 102. The computing device 124 can also control the current source 126 to stop the flow of current such that no magnetic field is generated by the electromagnet 128, thereby the impedance of the conductive pathway 102 is not altered. A researcher or engineer can input commands into the computing device 124 for controlling the magnitude of the magnetic field applied to the conductive pathway 102 to selectively alter the impedance of the conductive pathway 102 for simulating impedance variations that could result from bulk-manufacturing processes.

Impedance of a conductive pathway can be altered based on the magnetic field direction with respect to the direction of signal transmission. Particularly, for example, impedance of the conductive pathway 102 may be increased by inducing a magnetic field in a direction opposing signal transmission. For example, transmitter 106 may communicate electrical signals to the receiver 108 using the conductive pathway 102 and in a direction generally designated by arrow 132. To increase impedance to this signal transmission, the current source 126 communicates current through the conductive line 130 such that the magnetic field generated therefrom generally opposes the transmission of electrical signals communicated from the transmitter 106 to the receiver 108.

Conversely, to decrease impedance to signal transmission in the general direction of arrow 132, another current source 134 and electromagnet 136 having a coiled conductive line 138 may be oriented to produce a magnetic field that is generally in a direction that is the same as the signal transmission. The resulting magnetic field thereby causes a decrease in the impedance of the conductive pathway 102. Alternatively, the current source 134 and electromagnet 134, or any other magnetic field generator described herein, may be applied to a conductive pathway on the printed circuit board 104 that is different than the conductive pathway 102. Any number of magnetic field generators may be used while testing a printed circuit board in accordance with embodiments of the present invention for simulating impedance variation ranges on one or more conductive pathways of the printed circuit board.

The computing device 124 may include a computer, which may include one or more computer readable medium(s). The computer may include suitable hardware, such as a processor, and software (including firmware, resident software, microcode, etc.) for interfacing with and controlling the current sources 126 and 134 to vary the current applied to the coils of the electromagnets 128 and 136, respectively. In addition, the computer may include a suitable user interface (e.g., a keyboard, a display, a mouse, etc.) for allowing an operator to input commands for controlling the current sources 126 and 134.

Figure 3:
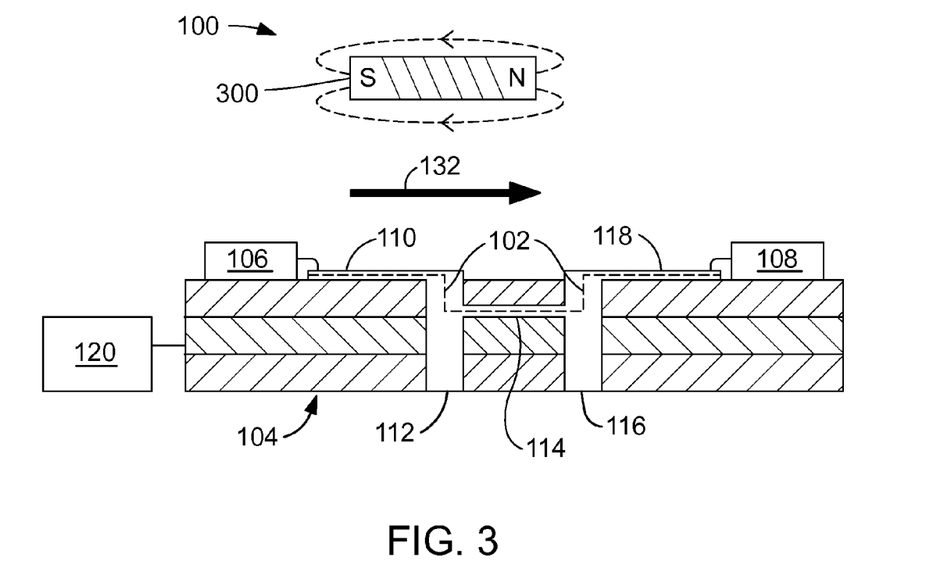
FIG. 3 sets forth a cross-sectional front plan view of a printed circuit board and a magnetic field generator according to embodiments of the present invention.
Figure 4:
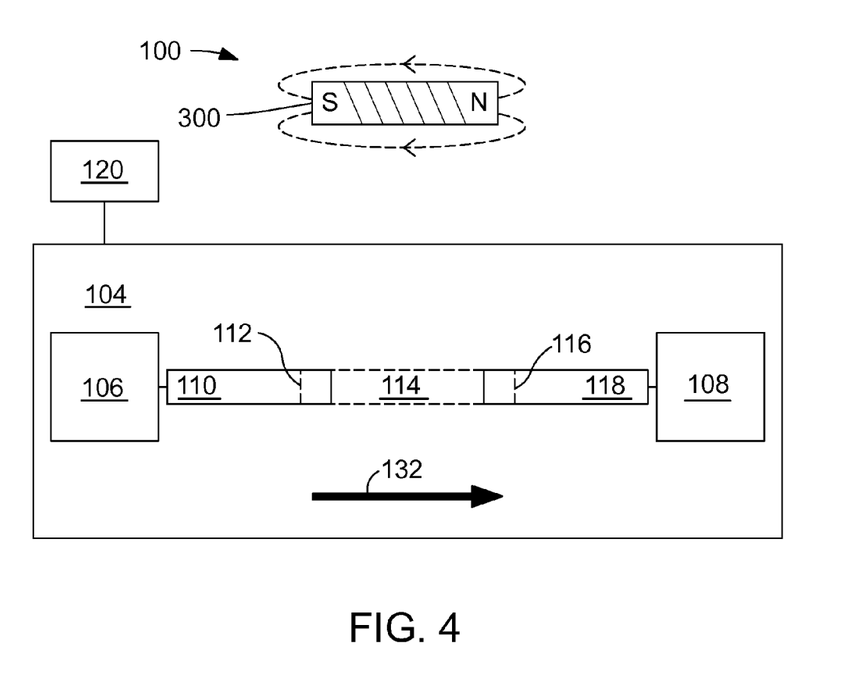
FIG. 4 sets forth a top plan view of a printed circuit board and a magnetic field generator according to embodiments of the present invention.

In another embodiment of the present invention, a permanent magnet may be used in place of the electromagnet and computing device shown in FIGS. 1 and 2 for altering impedance of a conductive pathway. FIGS. 3 and 4 illustrate a system using a permanent magnet as a magnetic field generator for generating a magnetic field for altering impedance of a conductive pathway. With reference now to FIGS. 3 and 4, the printed circuit board 104 is the same as the printed circuit board 104 of FIGS. 1 and 2. In this example, a permanent magnet 300 generates a magnetic field at the conductive pathway 114 for altering the impedance of the conductive pathway 114. The permanent magnet 300 may be used in place of or together with the magnetic field generator 122 and the computing device 124 for generating a magnetic field to alter the impedance of the conductive pathway 114. The permanent magnet 300 may be any suitable object made from a material that is magnetized and creates its own persistent magnetic field.

The permanent magnet 300 may be selectively positioned with respect to the conductive pathway 102 for altering impedance of the conductive pathway 102. The closer the permanent magnet 300 is positioned to the conductive pathway 102, the higher the impedance of the conductive pathway 102. Conversely, the further the permanent magnet 300 is positioned from the conductive pathway 102, the lower the impedance of the conductive pathway 102. The positioning of the permanent magnet 300 with respect to the conductive pathway 102 will vary depending on the strength of the magnetic field generated by the permanent magnet 300, the physical topology of the printed circuit board 104, and the desired alteration to the impedance of the conductive pathway 102.

The strength and orientation of the permanent magnet 300 also affects alteration of the impedance of the conductive pathway 102. With respect to the permanent magnet's 300 strength, the higher its strength, the greater the effect on the strength of the conductive pathway 102. With respect to the orientation of the permanent magnet 300, the placement of the north and south ends of the permanent magnet 300 may be switched for changing the direction of the magnetic field with respect to signal transmission. As discussed above, to increase impedance to a signal transmitted from the transmitter 106 to the receiver 108, the permanent magnet's poles can be positioned as shown in FIGS. 3 and 4 such that the magnetic field generated therefrom generally opposes the transmission of electrical signals communicated from the transmitter 106 to the receiver 108. Conversely, to decrease impedance to signal transmission in the general direction of arrow 132, the permanent magnet 300 may be moved such that the poles N and S are switched, and as a result, the magnetic field causes a decrease in the impedance of the conductive pathway 102.

In the examples provided herein, systems and methods are described for magnetic field generation for altering a single conductive pathway on a printed circuit board. However, one of ordinary skill in the art will understand that a magnetic field generated in accordance with embodiments of the present invention may be applied to more than one conductive pathway on a printed circuit board. Further, a magnetic field generated in accordance with embodiments of the present invention may be applied to a conductive pathway on any type of microelectronic package.

It should also be noted that although more than one electromagnet is shown in FIGS. 1 and 2 and only one permanent magnet is shown in FIGS. 3 and 4, such component numbers are not a requirement or limitation for the present invention. Rather, any suitable number of electromagnets, permanent magnets, or combinations thereof may be used for generating magnetic fields for affecting the impedance of a conductive pathway on a microelectronic package. The number of such magnetic field generators that alter the impedance of conductive pathway(s) can vary from one microelectronic package topology to another depending on the physical topology of the microelectronic package and the desired alteration to the impedance of the conductive pathway(s).

As mentioned above, excessive crosstalk in conductive pathways of printed circuit boards can adversely affect system performance. The methods and systems described herein in accordance with embodiments of the present invention may be utilized for simulating crosstalk effects on one or more conductive pathways of a printed circuit board or other microelectronic package. An exemplary method according to embodiments of the present invention includes applying a magnetic field to a conductive pathway on a microelectronic package. For example, the magnetic fields applied to the conductive pathway 102 described with respect to FIGS. 1-4 may be applied to the conductive pathway 102 for simulating crosstalk effects. Now referring to FIGS. 1-4, the exemplary method also includes controlling a magnitude of the magnetic field at the conductive pathway 102 as described herein with respect to embodiments of the present invention. The magnitude of the magnetic field at the conductive pathway 102 may be controlled for altering crosstalk effect on the conductive pathway 102. The strength of the magnet field applied to the conductive pathway 102 may be varied over time for simulating crosstalk effects. While the crosstalk effects are simulated, the test equipment 120 may apply tests to the printed circuit board 104. Accordingly, a researcher or engineer may test the printed circuit board 104 while controlling simulation of crosstalk effects.

As referred to herein, a magnetic field generator may be any component or device capable of generating a magnetic field. For example, a magnetic field generator may be a permanent magnet made of, but not limited to, a magnetically hard ferromagnetic material that remains magnetized. In another example, a magnetic field generator may include an electromagnet, the strength of which can be controlled by current output from any suitable current source. As mentioned above, an electromagnet may be made from a coil of wire which acts as a magnet when an electric current passes through it, but stops when the current stops.

The coil of the electromagnet may be wrapped around a core of ferromagnetic material, such as, for example, a core of ferromagnetic material like steel, which enhances the magnetic field produced by the coil.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.), or an embodiment combining software and hardware aspects that may all generally be referred to herein as a "circuit," "module," or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium (including, but not limited to, non-transitory computer readable storage media). A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter situation scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

As mentioned above, exemplary methods for applying a magnetic field to a conductive pathway on a microelectronic package for controlling an impedance of the conductive pathway in accordance with embodiments of the present invention are described with reference to the accompanying drawings. The impedance of the conductive pathway may be altered within a predetermined impedance range to simulate bulk-manufacture variations in a testing environment. Prior to its use in testing a microelectronic package, a system according to embodiments of the present invention may be calibrated to the microelectronic package. For further explanation, FIG. 5 sets forth a flow chart illustrating an exemplary method of calibrating a system and altering impedance of a conductive pathway in a testing environment according to embodiments of the present invention. The method of FIG. 5 includes measuring 500 an impedance of a conductive pathway on a printed circuit board that may be produced in a laboratory. For example, a time-domain reflectometer may be used for measuring an impedance of the conductive pathway 102 on the printed circuit board 104 shown in FIGS. 1 and 2. In this example, the conductive pathway 102 may be measured at a nominal 100 ohm impedance. A laboratory researcher or engineer may determine to test the printed circuit board 104 at an impedance variation range of ±12%, for example, from the nominal impedance value. The laboratory researcher or engineer may then calibrate a system as described herein below for generating and varying a magnetic field for altering the impedance of the conductive pathway 102 at ±12% from the nominal impedance value. This impedance variation may be deemed to be the possible variation from the actual design in a printed circuit board produced by bulk-manufacturing. Any suitable impedance variation range may be applied to a printed circuit board or other microelectronic package for testing by a laboratory researcher or engineer.

Figure 5:
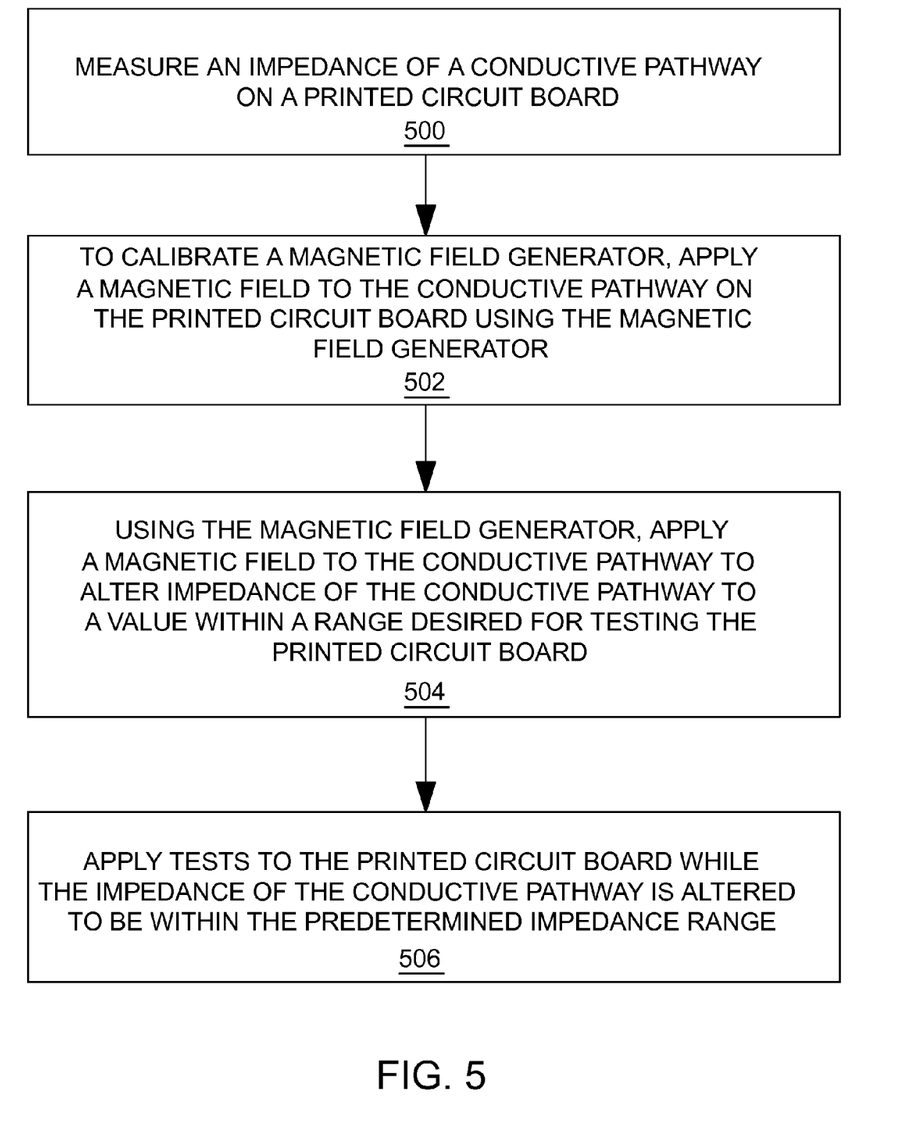
FIG. 5 sets forth a flow chart illustrating an exemplary method of calibrating a system and altering impedance of a conductive pathway in a testing environment according to embodiments of the present invention.

To calibrate a system according to embodiments of the present invention, the method of FIG. 5 includes applying 502 a magnetic field to the conductive pathway on the printed circuit board using a magnetic field generator. The magnetic field can be varied as described herein for altering the magnitude of the magnetic field applied to the conductive pathway, thereby the impedance of the conductive pathway is also varied. As the impedance of the conductive pathway is varied, the control of the magnetic field generator for achieving a range of impedance values for the conductive pathway can be known by measuring the impedance with a time-domain reflectometer as the magnetic field is varied. In this way, the magnetic field generator is calibrated because the laboratory researcher or engineer can know the control inputs needed for varying the magnetic field to achieve a desired impedance range. In the exemplary system 100 of FIGS. 1 and 2, the positioning and/or current input into the electromagnet 128 can be varied for determining the positioning and/or control of the current needed for achieving a desired impedance range for conductive pathway 102. In the exemplary system of FIGS. 3 and 4, the permanent magnet 300 may be moved to different positions for determining the positioning needed for achieving a desired impedance range for conductive pathway 102.

After calibration of a system according to embodiments of the present invention, the method of FIG. 5 includes applying 504 a magnetic field to the conductive pathway to alter the impedance of the conductive pathway to a value within a range desired for testing the printed circuit board. For example, the laboratory researcher or engineer can know the control input needed for achieving a desired impedance value for testing the printed circuit board 104. The magnetic field generator (e.g., the electromagnet magnet 128 or permanent magnet 300) may be controlled to apply a magnetic field to the conductive pathway 102 for achieving the desired impedance value.

Next, the method of FIG. 5 includes applying 506 tests to the printed circuit board while the impedance of the conductive pathway is altered to be within the predetermined impedance range. For example, the laboratory researcher or engineer may apply tests to the printed circuit board 104 while the magnetic field generator is controlled to apply a magnetic field to the conductive pathway 102 for achieving the desired impedance value. The magnetic field may be held at that value until testing is complete, or the magnetic field may be altered to vary the impedance of the conductive pathway over a range while the printed circuit board is tested. As a result, the laboratory researcher or engineer may simulate impedance variations in a conductive pathway of a printed circuit board for testing of the printed circuit board. These are the impedance variations that may be expected to result in bulk-manufacturing of the printed circuit board.

In view of the explanations set forth above, readers will recognize that the benefits of the systems and methods according to embodiments of the present invention for simulating bulk-manufactured, printed circuit board impedance variations during testing include: simpler and more accurate methods for simulating manufacturing variations during laboratory testing; and reducing the likelihood of field failures in bulk-manufactured, printed circuit boards.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
applying a magnetic field to a conductive pathway on a microelectronic package;
controlling a magnitude of the magnetic field at the conductive pathway for altering an impedance of the conductive pathway to be within a predetermined impedance range; and
testing the microelectronic package while the impedance of the conductive pathway is altered to simulate impedance variations of the conductive pathway within the predetermined impedance range.

2. The method of claim 1, wherein the microelectronic package is a printed circuit board.

3. The method of claim 1, wherein applying a magnetic field comprises using an electromagnet to apply the magnetic field to the conductive pathway.

4. The method of claim 3, wherein controlling a magnitude of the magnetic field comprises moving the electromagnet with respect to the conductive pathway.

5. The method of claim 3, wherein controlling a magnitude of the magnetic field comprises controlling electric current passing through the electromagnet.

6. The method of claim 1, wherein applying a magnetic field comprises using a permanent magnet to apply the magnetic field to the conductive pathway.

7. The method of claim 6, wherein controlling a magnitude of the magnetic field comprises moving the permanent magnet with respect to the conductive pathway.

8. The method of claim 1, wherein controlling a magnitude of the magnetic field comprises controlling the magnitude of the magnetic field to one of increase and decrease the impedance of the conductive pathway to be within a predetermined impedance range.

9. A method comprising:
applying a magnetic field to a conductive pathway on a microelectronic package;
controlling a magnitude of the magnetic field at the conductive pathway for altering a crosstalk effect on the conductive pathway to be within a predetermined crosstalk effect range; and
testing the microelectronic package while the crosstalk effect is altered to simulate crosstalk effect variations of the conductive pathway within the predetermined crosstalk effect range.

10. The method of claim 9, wherein the microelectronic package is a printed circuit board.

11. The method of claim 9, wherein applying a magnetic field comprises using an electromagnet to apply the magnetic field to the conductive pathway.

12. The method of claim 9, wherein applying a magnetic field comprises using a permanent magnet to apply the magnetic field to the conductive pathway.

13. A system comprising:
a microelectronic package including a conductive pathway;
test equipment coupled to the microelectronic package for testing the microelectronic package;
a magnetic field generator positioned in proximity to the conductive pathway and configured to generate a magnetic field for application to the conductive pathway such that the magnetic field simulates at least one of an impedance value and crosstalk effect of the conductive pathway during testing of the microelectronic package; and
a computing device configured to:
determine a predetermined range of one of impedance values and crosstalk effect values for testing the microelectronic package based on a calibration of the magnetic field generator; and
control the magnitude of the magnetic field generated by the magnetic field generator to simulate the one of impedance values and crosstalk values within the predetermined range during testing of the microelectronic package.

14. The system of claim 13, wherein the microelectronic package is a printed circuit board.

15. The system of claim 13, wherein the magnetic field generator is a permanent magnet.

16. The system of claim 13, wherein the magnetic field generator includes an electromagnet.

17. The system of claim 16, wherein the computing device is further configured to control electric current passing through the electromagnet.

18. The system of claim 16, wherein the magnetic field generator includes another electromagnet coupled to the computing device for control of the other electromagnet by the computing device.

19. The system of claim 13, wherein the calibration of the magnetic field generator comprises the computing device measuring the impedance of the conductive pathway while the magnetic field generator applies the magnetic field to the conductive pathway.

20. The system of claim 19, wherein the magnetic field generator includes an electromagnet, and
wherein the computing device is coupled to the electromagnet and configured to control a magnitude of electric current passing through the electromagnet for controlling the magnitude of the magnetic field applied at the conductive pathway.

21. The system of claim 19, further comprising an electronic meter coupled to the microelectronic package and configured to measure an impedance of the conductive pathway while the magnetic field is being applied to the conductive pathway for determining the measured impedance.

* * * * *